US012144175B2

(12) United States Patent
Wang et al.

(10) Patent No.: US 12,144,175 B2
(45) Date of Patent: Nov. 12, 2024

(54) THREE DIMENSIONAL NAND MEMORY DEVICE WITH NOVEL SUPPORT STRUCTURES

(71) Applicant: Yangtze Memory Technologies Co., Ltd., Hubei (CN)

(72) Inventors: Di Wang, Wuhan (CN); Rui Su, Wuhan (CN); Zhongwang Sun, Wuhan (CN); Zhiliang Xia, Wuhan (CN); Wenxi Zhou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 658 days.

(21) Appl. No.: 17/246,750

(22) Filed: May 3, 2021

(65) Prior Publication Data

US 2021/0257386 A1   Aug. 19, 2021

Related U.S. Application Data

(63) Continuation of application No. PCT/CN2020/074058, filed on Jan. 28, 2020.

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10
See application file for complete search history.

(56) References Cited

U.S. PATENT DOCUMENTS

| 9,780,112 B2 | 10/2017 | Liu et al. |
| 9,985,098 B2 | 5/2018 | Matsumoto et al. |
(Continued)

FOREIGN PATENT DOCUMENTS

| CN | 107492554 A | 12/2017 |
| CN | 108055874 A | 5/2018 |
(Continued)

OTHER PUBLICATIONS

K. R. Williams, K. Gupta and M. Wasilik, "Etch rates for micromachining processing—Part II," in Journal of Microelectromechanical Systems, vol. 12, No. 6, pp. 761-778, Dec. 2003, doi: 10.1109/JMEMS.2003.820936. (Year: 2003).*

(Continued)

*Primary Examiner* — Lex H Malsawma
*Assistant Examiner* — Bruce R. Smith
(74) *Attorney, Agent, or Firm* — Oblon, McClelland, Maier & Neustadt, L.L.P.

(57) ABSTRACT

Aspects of the disclosure provide a semiconductor device. The semiconductor device includes a first stack of layers including a source connection layer and a second stack of layers including gate layers and insulating layers. The gate layers and the insulating layers are stacked alternatively upon the first stack of layers. Further, the semiconductor device includes channel structures that are formed along the first direction in the first stack of layers and the second stack of layers, and a gate line cut structure having a trench that cuts through the first stack of layers and the second stack of layers. The trench is filled with at least an insulating layer. The semiconductor device includes a support structure having a first portion that is disposed at a side of the gate line cut structure and extended from the side of the gate line cut structure and underneath the second stack of layers.

14 Claims, 10 Drawing Sheets

(51) Int. Cl.
*H10B 41/27* (2023.01)
*H10B 43/10* (2023.01)

(56) References Cited

U.S. PATENT DOCUMENTS

| | | | |
|---|---|---|---|
| 9,991,271 | B2 | 6/2018 | Kang et al. |
| 10,008,570 | B2 | 6/2018 | Yu et al. |
| 10,020,363 | B2 | 7/2018 | Ogawa et al. |
| 10,115,736 | B2 | 10/2018 | Liu et al. |
| 10,224,340 | B2 | 3/2019 | Hada et al. |
| 10,381,443 | B2 | 8/2019 | Matsumoto et al. |
| 2017/0117289 | A1* | 4/2017 | Liu ............. H10B 41/27 |
| 2017/0358590 | A1 | 12/2017 | Kang et al. |
| 2018/0006054 | A1 | 1/2018 | Liu et al. |
| 2018/0122904 | A1 | 5/2018 | Matsumoto et al. |
| 2018/0122905 | A1 | 5/2018 | Ogawa et al. |
| 2018/0122906 | A1* | 5/2018 | Yu ............. H10B 41/27 |
| 2018/0226423 | A1 | 8/2018 | Kang et al. |
| 2018/0261671 | A1 | 9/2018 | Matsumoto et al. |
| 2018/0366486 | A1 | 12/2018 | Hada et al. |
| 2019/0371807 | A1* | 12/2019 | Nishikawa ............. H10B 41/41 |

FOREIGN PATENT DOCUMENTS

| | | |
|---|---|---|
| CN | 109346477 A | 2/2019 |
| CN | 109817633 A | 5/2019 |
| CN | 110088905 A | 8/2019 |
| CN | 110462829 A | 11/2019 |
| TW | 561616 B | 11/2003 |
| TW | 201421650 A | 6/2014 |
| TW | 202002177 A | 1/2020 |

OTHER PUBLICATIONS

Chinese Office Action issued Aug. 27, 2021 in Chinese Patent Application No. 202080000221.2, 5 pages.
International Search Report issued Oct. 28, 2020 in PCT/CN2020/074058, filed on Jan. 28, 2020, 5 pages.
Chinese Combined Office Action and Search Report issued Oct. 12, 2020 in Chinese Patent Application No. 202080000221.2, 9 pages (with English translation of categories of cited documents).
Chinese Office Action issued Jan. 28, 2021 in Chinese Patent Application No. 202080000221.2, 6 pages (with English translation of categories of cited documents).

* cited by examiner

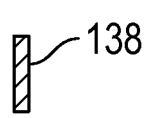 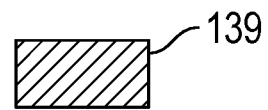 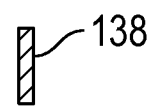
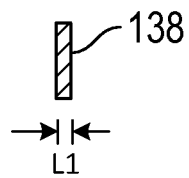 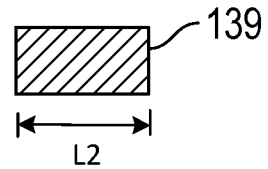 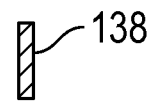
FIG. 1D
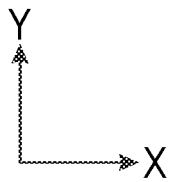

THREE DIMENSIONAL NAND MEMORY DEVICE WITH NOVEL SUPPORT STRUCTURES

RELATED APPLICATION

This application is a bypass continuation of International Application No. PCT/CN2020/074058, filed on Jan. 28, 2020. The entire disclosure of the prior application is hereby incorporated by reference in its entirety.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes a first stack of layers including a source connection layer and a second stack of layers including gate layers and insulating layers. The gate layers and the insulating layers are stacked alternatively upon the first stack of layers. Further, the semiconductor device includes channel structures that are formed along the first direction in the first stack of layers and the second stack of layers, and a gate line cut structure having a trench that cuts through the first stack of layers and the second stack of layers. The trench is filled with at least an insulating layer. Then, the semiconductor device includes a support structure having a first portion that is disposed at a side of the gate line cut structure and extended from the side of the gate line cut structure and underneath the second stack of layers.

In some embodiments, the support structure has a second portion embedded in the gate line cut structure. In some examples, the support structure has two arm structures that are disposed on opposite sides of the second portion, and extended from the side of the gate line cut structure and underneath the second stack of layers.

In some embodiments, the first stack of layers includes one or more bottom select gate layers. Then, the semiconductor device includes a bottom select gate cut bar that is disposed in the first stack of layers, and is configured to insulate the one or more bottom select gate layers on either side of the bottom select gate cut bar. In some examples, the bottom select gate cut bar and the first portion of the support structure are of substantially the same height level. In some examples, the bottom select gate cut bar and the support structure are formed of the same materials.

In some embodiments, the support structure is configured to have a "U" shape with the two arm structures that extend away from the gate line cut structure.

In an embodiment, the support structure is disposed in a gate line pick up region with nearby channel structures being dummy channel structures, and the support structure has a length that is longer than a threshold.

In another embodiment, the support structure is disposed in a region with nearby channel structures configured for data storage, and the support structure has a length that is shorter than a threshold.

In some examples, the support structure is formed of a material with an etch rate selectivity to source sacrificial layers being larger than a threshold. The source sacrificial layers are replaced by the source connection layer. In an example, the support structure is formed of a material with an etch rate selectivity to silicon oxide and silicon nitride being larger than a threshold. In an example, the support structure is formed of aluminum oxide.

Aspects of the disclosure provide a method for fabricating a semiconductor device. The method includes stacking first layers including source sacrificial layers on a substrate along a first direction perpendicular to a main surface of the substrate, and forming a support structure in the first layers. Further, the method includes stacking, on the first layers, second layers including gate sacrificial layers and insulating layers and forming channel structures that extend in the first direction into the first layers and the second layers. Then, the method includes forming a gate line cut trench into the second layers and the first layers. The support structure has a first portion that is disposed at a side of the gate line cut trench, and extended from the gate line cut trench and underneath the second stack of layers. Then, the method includes replacing the source sacrificial layers with at least a source connection layer, with the first portion of the support structure remaining on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1D shows an example of a mask in accordance with some embodiments.

DETAILED DESCRIPTION

Figure 1A:
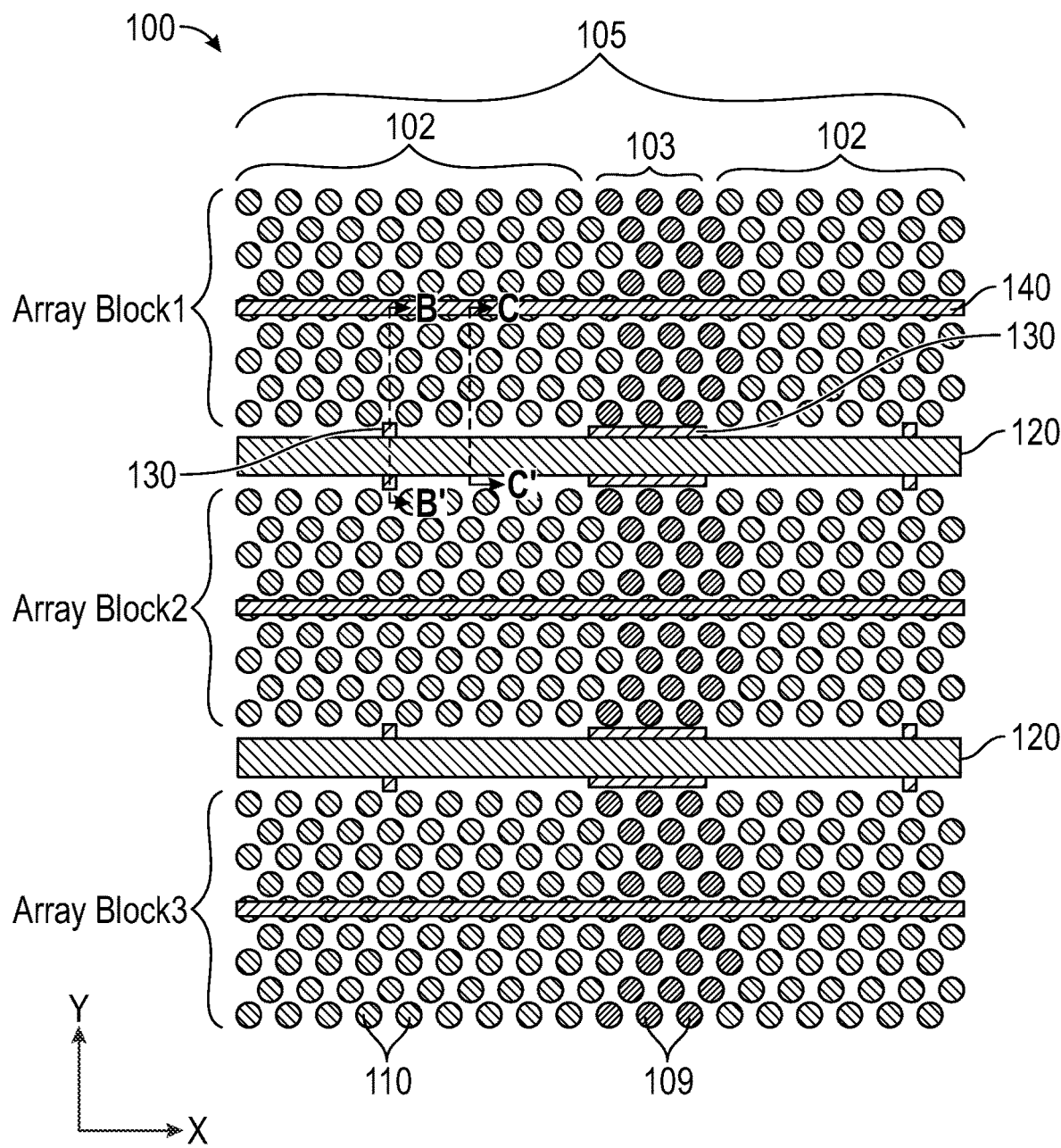
FIGS. 1A-1C show cross-sectional views of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various fabrication technologies, such as sidewall selective epitaxial growth (SEG), and the like are developed to fabricate vertical memory devices. The sidewall SEG technology is also referred to as SWS technology. The SWS technology is used during a fabrication of a semiconductor device, to replace source sacrificial layers underneath a stack of layers for forming vertical memory cell strings with an epitaxial layer that can be used to form source connections for the vertical memory cell strings. During the replacement process, after the source sacrificial layers are removed, and before the epitaxial layer is fully formed, the stack of layers for forming the vertical memory cell strings may have a risk of collapse.

The present disclosure provides techniques to support the layers above the source sacrificial layers after the source sacrificial layers are removed and reduce the risk of collapse. Generally, the layers above the source sacrificial layers are supported by channel structures (some are real channel structures and some are dummy channel structures) during the replacement of the source sacrificial layers with the epitaxial layer. The channel structures include a semiconductor layer that can be configured as channels for the vertical memory cell strings. The semiconductor layer is surrounded by a stack of insulating and floating gate layers (e.g., a tunneling insulating layer, a charge storage layer and a blocking insulating layer), that can form the floating gates for the vertical memory cell string. The stack of insulating and floating gate layers at the bottom of the channel structures are removed during the replacement process, and the semiconductor layer is exposed at the bottom as a sidewall for growing the epitaxial layer. While the stack of insulating and floating gate layers at the bottom of the channel structures is removed, the channel structures are thinner at the bottom, and provide less support to the upper layers, and thus the semiconductor device may have a risk of collapse.

In some examples, gate line cut trenches are used during fabrication for the replacement of the source sacrificial layers with the epitaxial layer. The gate line cut trenches are later filled with materials to form gate line cut structures. According to some aspects of the disclosure, support structures can be embedded at the bottom of the gate line cut trenches (or structures). The support structures are configured to be wider than the gate line cut trenches (or structures) in a dimension, and the wider portions will not be etched away during the trench etch for the gate line cut trenches and the removal of the source sacrificial layers, thus the wider portions can form arm structures that extend from sides of the gate line cut trenches (structures) and hold upper layers. In some examples, the support structures are formed of materials that have relatively high etch rate selectivity to the source sacrificial layers, thus the arm structures are not completely etched away during the removal of the source sacrificial layers. Thus, the arm structures can provide support to the upper layers during the replacement of the source sacrificial layers with the epitaxial layer.

In some embodiments, the support structures are formed with other suitable structures, such as bottom select gate (BSG) cut bars to reduce manufacturing cost. In an embodiment, a BSG cut mask also includes patterns that define the support structures. Thus, the support structures and the BSG cut bars can be formed by the same processes and based on the same mask.

Figure 1B:
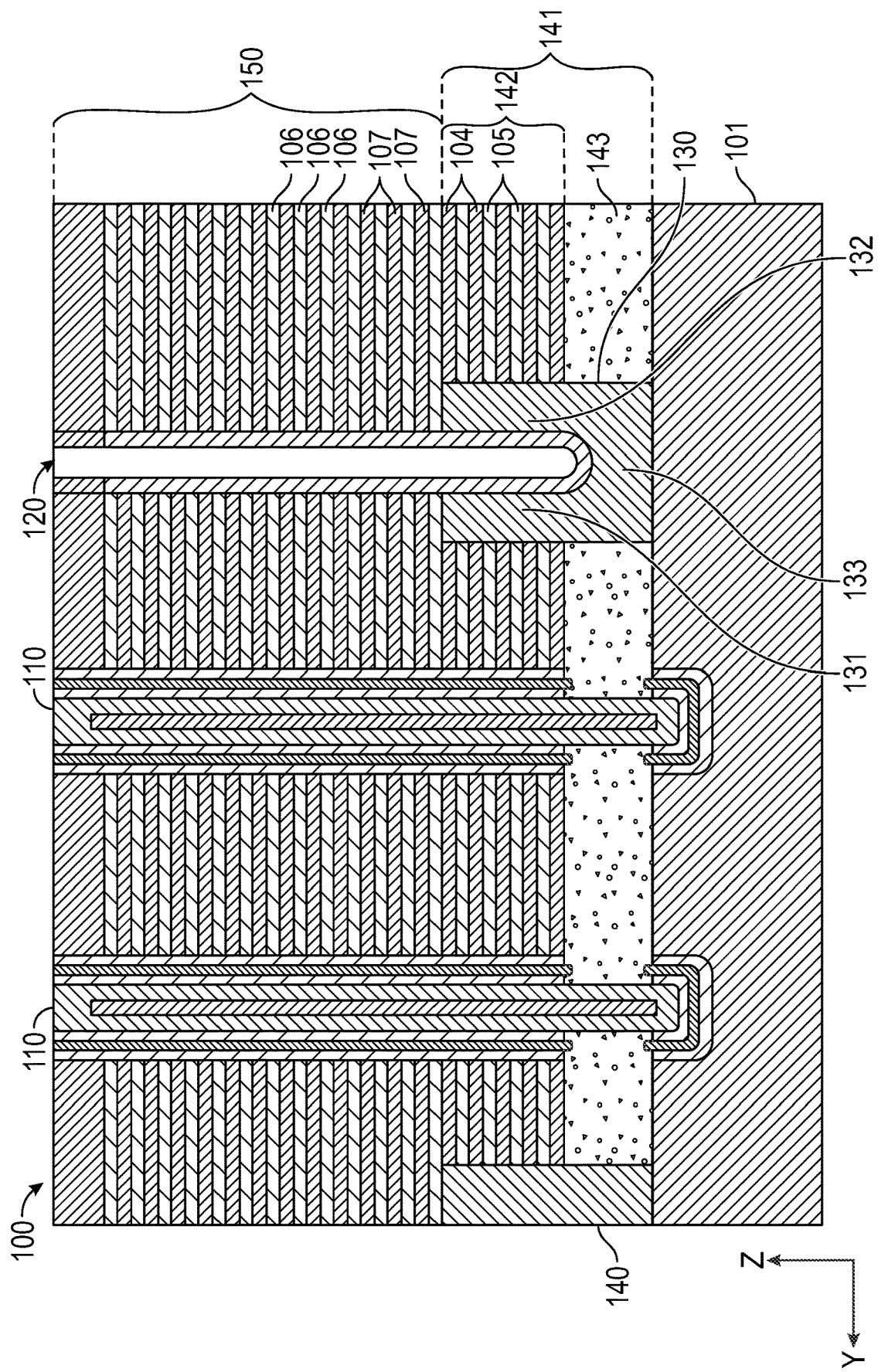
Figure 1C:
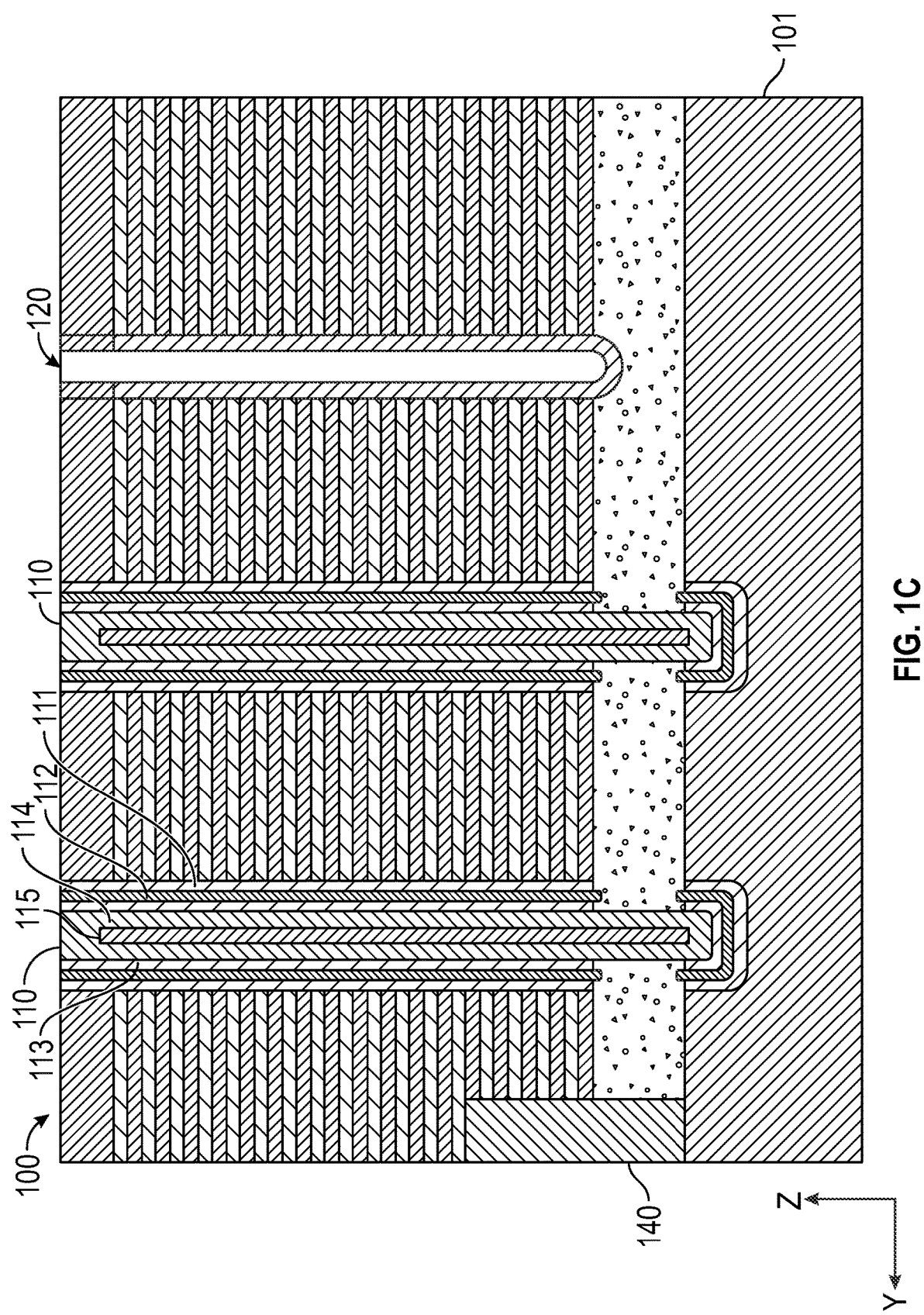

FIG. 1A shows a top down view of a portion of a semiconductor device 100, and FIGS. 1B and 1C show vertical cross-sectional views of the semiconductor device 100 in accordance with some embodiments of the disclosure. The semiconductor device 100 includes a substrate 101 (e.g., wafer substrate), and circuits formed on the thereupon. A main surface of the substrate 101 (e.g., surface of a wafer) extends for example in the X direction and the Y direction. The top down view (e.g., X-Y plane) is parallel to the main surface of the substrate 101, and the vertical cross-sectional view (e.g., X-Z plane, Y-Z plane) is perpendicular to the main surface of the substrate 101. FIG. 1A shows a line B-B' for generating the vertical cross-sectional view in FIG. 1B; and a line C-C' for generating the vertical cross-sectional view in FIG. 1C.

For simplicity, some components are omitted from the views.

The semiconductor device 100 refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like. The substrate 101 can be any suitable substrate, such as a silicon (Si) substrate, a germanium (Ge) substrate, a silicon-germanium (SiGe) substrate, and/or a silicon-on-insulator (SOI) substrate. The substrate 101 may include a semiconductor material, for example, a Group IV semiconductor, a Group III-V compound semiconductor, or a Group II-VI oxide semiconductor. The Group IV semiconductor may include Si, Ge, or SiGe. The substrate 101 may be a bulk wafer or an epitaxial layer.

In various embodiments, the semiconductor device 100 includes three dimensional (3D) NAND memory circuitry formed on the substrate 101. The semiconductor device 100 can include other suitable circuitry (not shown), such as logic circuitry, power circuitry, and the like that is formed on the substrate 101, or other suitable substrate, and is suitably coupled with the 3D NAND memory circuitry. Generally, the 3D NAND memory circuitry includes memory arrays and peripheral circuitry (e.g., address decoder, driving circuits, sense amplifier and the like). The memory arrays are formed in a core region as arrays of vertical memory cell strings. The peripheral circuitry is formed in a peripheral region. Besides the core region and the peripheral region, the semiconductor device 100 includes a staircase region to facilitate making contacts to the gates of the memory cells in the vertical memory cell strings. The gates of the memory cells in the vertical memory cell strings are connected with word lines in the NAND memory architecture.

FIGS. 1A-1C show support structures 130 in a core region 105 to provide additional support to the upper layers in the core region 105 during the replacement of the source sacrificial layers with the epitaxial layer. It is noted that similar support structures can be formed in the staircase region to provide support to the upper layers in the staircase region during the replacement of the source sacrificial layers with the epitaxial layer.

In the example shown in FIGS. 1A-1C, the support structures 130 are formed with BSG cut bars 140 at the same time and based on the same mask. FIG. 1D shows a mask 199 for defining patterns of the support structures 130 and the BSG cut bars 140. Specifically, the mask 199 includes patterns 149 that define the BSG cut bars 140 and includes patterns 138 and 139 that define the support structures 130.

Referring to FIG. 1A, the core region 105 includes an array of memory cell strings 110. Generally, to facilitate the removal of the sacrificial layers (e.g., source sacrificial layers, gate sacrificial layers), multiple gate line cut trenches are disposed in the array. The gate line cut trenches are later filled with materials and become gate line cut structures. In the example of FIGS. 1A-1C, the gate line cut structures 120 divide the memory cell strings 110 into array blocks, such as array blocks 1-3. Each of the array blocks 1-3 can be further divided into smaller operation units (e.g., pages) by BSG cut bars 140 and top select gate cut bars (not shown). The BSG cut bars 140 are configured to electrically isolate bottom select gate layers of neighboring operation units (e.g., pages) for example. Thus, neighboring operation units can be controlled individually for some operations based on the individual controls of the bottom select gates.

In some embodiments, the BSG cut bars 140 are formed in a first stack of layers 141 that are under a second stack of layers 150, and thus the support structures 130 are formed in the first stack of layers 141 that are under the second stack of layers 150. The first stack of layers 141 includes source connection layers 143 and layers 142 that form the bottom select transistors, such as bottom select gate layers 105 and insulating layers 104. The bottom select gate layers 105 and the insulating layers 104 are stacked alternatively. The second stack of layers 150 includes layers that form the memory cells and top select transistors, such as gate layers 106 and insulating layers 107. The gate layers 106 and the insulating layers 107 are stacked alternatively.

The vertical memory cell strings are formed in the first stack of layers 141 and the second stack of layers 150 that is stacked on the first stack of layers 141. In some embodiments, each vertical memory cell string includes memory cell transistors and select transistors, such as one or more bottom select transistors, one or more top select transistors and the like. The bottom select transistors and the top select transistors can be controlled to select/deselect the vertical memory cell string for certain operations. The bottom select gate layers 105 correspond to gates of the bottom select transistors. The gate layers 106 can correspond to gates of the memory cell transistors and the top select transistors. The bottom select gate layers 105 and the gate layers 106 are made of a gate stack materials, such as high dielectric constant (high-k) gate insulator layers, metal gate (MG) electrode, and the like. The insulating layers 104 and 107 are made of insulating material(s), such as silicon nitride, silicon dioxide, and the like.

According to some aspects of the disclosure, channel structures 110 are formed in the core region. In some embodiments, each of the channel structures 110 has a pillar shape that extends in the Z direction that is perpendicular to the direction of the main surface of the substrate 101. The plurality of channel structures 110 can be disposed separate from each other along the X direction and the Y direction, and can be disposed in some suitable array shape, such as a matrix array shape along the X direction and the Y direction, a zig-zag array shape along the X or Y direction, a beehive (e.g., hexagonal) array shape, and the like. In some embodiments, each of the channel structures 110 has a circular shape in the X-Y plane, and a pillar shape in the X-Z plane.

In some embodiments, some portions of the core region may not suitable for data storage, and the channel structures disposed on these portions may be dummy channel structures. In the FIG. 1A example, the core region 106 includes a gate line (GL) pickup region 103, and the channel structures 109 in the GL pickup region 103, are not used for data storage (e.g., not connected to bit lines). It is noted that other portions 102 of the core region 105 can be configured for data storage, and the channel structures 110 in the portion 102 of the core region 105 are real storage elements (e.g., are connected with bit lines).

In some embodiments, the GL pickup region 103 is used to make connections to the array common sources and route wires for transmitting the voltage signals for controlling the array common sources. In some examples, array common sources can be formed in the gate line cut structures 120. In some examples, the voltage signals for controlling the array common sources can be quite high, and the GL pickup region 103 is not suitable for data storage. Further, in some examples, while the GL pickup region 103 is used to route wires for the array common sources, there may be not enough space to route the bitlines for the channel structures 109 in the GL pick up region 103, thus the channel structures 109 are not used for data storage, and can be referred to as dummy channel structures 109.

It is noted that while core region 105 is used to illustrate various aspects of the present disclosure, the various aspects present disclosure can be applied to the other regions, such as staircase region of the semiconductor device 100.

In an embodiment, each of the channel structure 110 and dummy channel structures 109 is formed by materials in the circular shape in the X-Y plane, and extends in the Z direction. For example, each of dummy channel structures 109 and the channel structures 110 includes a blocking insulating layer 111 (e.g., silicon oxide), a charge storage layer (e.g., silicon nitride) 112, a tunneling insulating layer 113 (e.g., silicon oxide), a semiconductor layer 114, and an insulating layer 115 that have the circular shape in the X-Y plane, and extend in the Z direction, such as shown in FIG. 1C. In an example, the blocking insulating layer 111 (e.g., silicon oxide) is formed on the sidewall of holes for the dummy channel structures 109 and the channel structures 110, and then a charge storage layer (e.g., silicon nitride) 112, the tunneling insulating layer 113, the semiconductor layer 114, and the insulating layer 115 are sequentially stacked from the sidewall. The semiconductor layer 114 can be any suitable semiconductor material, such as polysilicon or monocrystalline silicon, and the semiconductor material may be un-doped or may include a p-type or n-type dopant. The insulating layer 115 is formed of an insulating material, such as silicon oxide and/or silicon nitride, and/or may be formed as an air gap.

According to some aspects of the disclosure, the support structures 130 can be formed with the BSG cut bars 140 in the first stack 141 (e.g., the support structures 130 has about the same height level as the BSG cut bars and the first stack 141 in the Z direction) that is underneath the second stack 150. In the Z direction, the first stack 141 includes source connection layers 143, and the layers 142 that form the bottom select transistors, such as the bottom select gate layers 105 and insulating layers 104.

Further, according to some aspects of the disclosure, the support structures 130 are embedded in the gate line cut structures 120, and are wider than the gate line cut structures 120. For example, the gate line cut structures 120 extend in the X direction, and the support structures 130 are disposed in the gate line cut structures 120 along the X direction. The width of the support structures 130 is wider than the width of the gate line cut structures 120 in the Y direction.

In some embodiments, the support structures 130 have a "U" shape in the cross-sectional view as shown in FIG. 1B. As shown, a support structure 130 has a portion 133 under the gate line cut structure 120, and portions 131 and 132 that extend out of the gate line cut structure 120 due to the wider width. The portion 133 directly under the gate line cut structure 120 is relatively thinner than the portions 131 and 132. The "U" shape is due to trench etch for the gate line cut trenches. Generally, the trench etch is directional, and leaves the portions 131 and 132 not being etched away. Further, the support structures 130 are formed of one or more layers of materials that are have relatively high etch rate selectivity to the source sacrificial layers, thus the support structures 130 are not removed when the source sacrificial layers are removed. The portions 131 and 132 can support the upper layers when the source sacrificial layers are removed, and the portions 131 and 132 can be referred to as arm structures 131 and 132.

According to some aspects of the disclosure, the support structures 130 can be configured to have suitable length, for example in the X direction. In an example, when a support structure 130 is disposed near real channel structures 110 (e.g., in the regions 102), the support structure 130 has relatively small length (e.g., smaller than a distance between neighboring channel structures in the X direction, corresponding to L1 in FIG. 1D) in the X direction to avoid getting in touch with the real channel structures 110. In another example, when a support structure 130 is disposed near dummy channel structures 109 (e.g., in the GL pick up region 103), then the support structure 130 can have a relatively large length (e.g., larger than the distance between neighboring channel structures in the X direction, corresponding to L2 in FIG. 1D) in the X direction.

In some embodiments, a BSG cut mask, such as the mask 199 in FIG. 1D, is used after a first stack of initial layers are stacked on the substrate 101. The first stack of initial layers includes the source sacrificial layers, and bottom select gate sacrificial layer(s). Later on, when the source sacrificial layers are replaced by the epitaxial layer 143, and the bottom select gate sacrificial layers are replaced by the bottom select gate layers 105, then the first stack of initial layers becomes the first stack of layers 141.

According to the BSG cut mask, trenches corresponding to the patterns 149, 138 and 139 are generated in the first stack of initial layers. The trenches are then filled with suitable materials, such as aluminum oxide, and the like. Then, a second stack of initial layers are stacked on the first stack of initial layers. The second stack of initial layers includes gate sacrificial layers, such as memory cell gate sacrificial layers and top select gate sacrificial layers, and insulating layers.

After the formation of vertical channel structures 110 (including 109) that extend through the second stack of initial layers and the first stack of initial layers, gate line cut trenches are formed down to a source sacrificial layer in the first stack of initial layers. Via the gate line cut trenches, the source sacrificial layers can be removed to form source connection openings. Further, the insulating and floating gate layers, such as the blocking insulating layer 111, the charge storage layer 112, the tunneling insulating layer 113 and the like, at the bottom (of the same height in Z direction as the source sacrificial layers) of the channel structures 110, can be removed, and the semiconductor layer 114 can be exposed as the sidewalls of the vertical channel structures 110. The exposed sidewalls of the bottom portions of the vertical channel structures 110 correspond to the sources of the vertical memory cell strings.

When the source sacrificial layers are removed, the channel structures 110 of the memory cells can support core regions. Additionally, the support structures 130 that are disposed along the gate line cut structures 120 can provide support at the edges of each array block, and prevent collapse from the edges.

Then, selective epitaxial growth (SEG) can be performed to fill the source connection openings with source connection layers, such as the epitaxial layer 143 and form the source connections with the channels of the vertical memory cell strings.

Further, via the gate line cut trenches, the gate sacrificial layers, such as the bottom select gate sacrificial layers in the first stack of initial layers, the gate sacrificial layers in the second stack of initial layers and the like can be replaced with gate layers.

Figure 2:
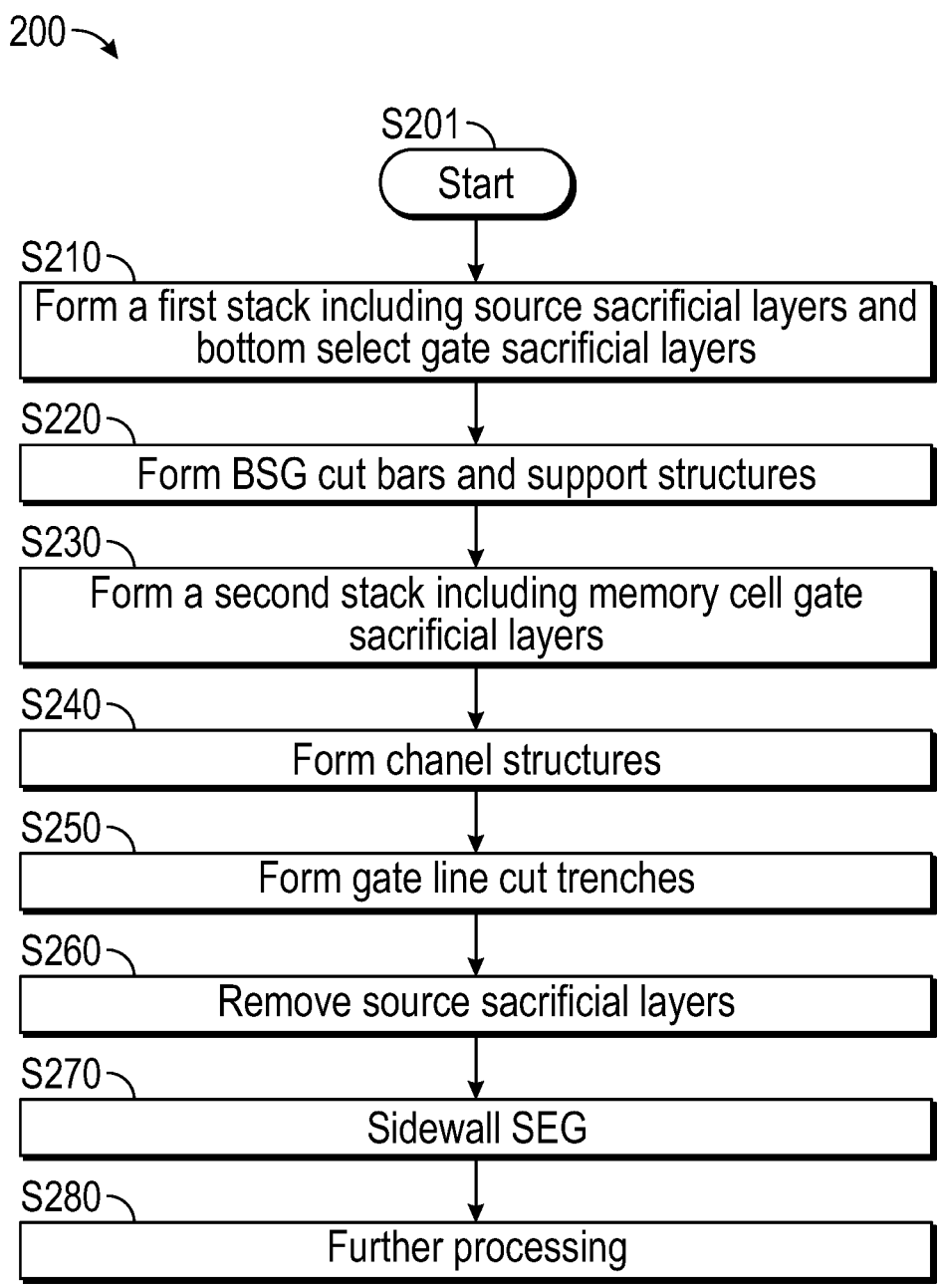
FIG. 2 shows a flow chart outlining a process example according to some embodiments of the disclosure.

FIG. 2 shows a flow chart outlining a process example for fabricating a semiconductor device, such as the semiconductor device 100 and FIGS. 3A-3F show cross-sectional views of the semiconductor device during fabrication according to some embodiments of the disclosure. The process starts at S201 and proceeds to S210.

At S210, a first stack of initial layers is formed on a substrate. The first stack of initial layers includes source sacrificial layers, bottom select gate sacrificial layers and insulating layers. Additionally, in some examples, buffer layers can be formed on the first stack of initial layers.

Figure 3A:
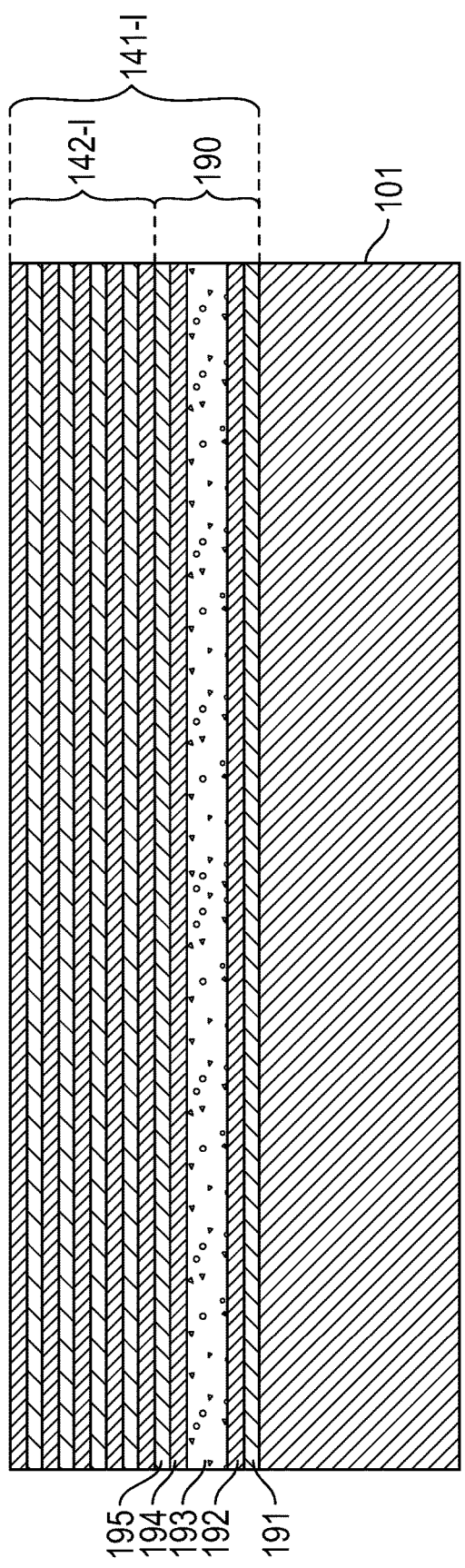
FIGS. 3A-3F show vertical cross-sectional views of the semiconductor device during a fabrication process according to some embodiments of the disclosure.

FIG. 3A shows the cross-sectional view of the semiconductor device 100 after the first stack of initial layers 141-I is formed on the substrate 101. The first stack of initial layers 141-I includes source sacrificial layers 190, and initial layers 142-I. The initial layers 142-I includes bottom select gate sacrificial layers and insulating layers that are stacked alternatively. When the source sacrificial layers 190 are replaced by source connection layers (e.g., epitaxial layer 143), and the bottom select gate sacrificial layers are replaced by the bottom select gate layers, the first stack of initial layers 141-I become the first stack of layers 141. In some examples, buffer layers (not shown) are also stacked on the first stack of initial layers 141-I. The buffer layers can protect the first stack during etch process or chemical mechanical polishing (CMP) process.

In an example, the source sacrificial layers 190 includes a silicon oxide layer 191, a silicon nitride layer 192, a polysilicon layer 193, a silicon nitride layer 194 and a silicon oxide layer 195 from bottom, such as shown in FIG. 3A.

Referring back to FIG. 2, at S220, BSG cut bars and initial support structures are formed in the first stack of initial layers 141-I. In some examples, a BSG cut mask, such as the mask 199, with patterns that define the BSG cut bars and the support structures, is used to transfer the patterns into the first stack of initial layers 141-I.

In an example, a lithography process and an etch process can be used to transfer the patterns of the BSG cut bars and the support structures from the BSG cut mask to the first stack of initial layers 141-I, to form trenches in the first stack of initial layers 141-I. Then, the trenches are filled with suitable materials, such as aluminum oxide and the like. In an example, the trenches are overfilled, and a chemical mechanical polishing (CMP) process is used to remove the overburden material. The buffer layers can prevent the first stack of initial layers 141-I from damage due to the CMP process. The buffer layers can be removed after the CMP process and before the formation of the second stack of initial layers.

Figure 3B:
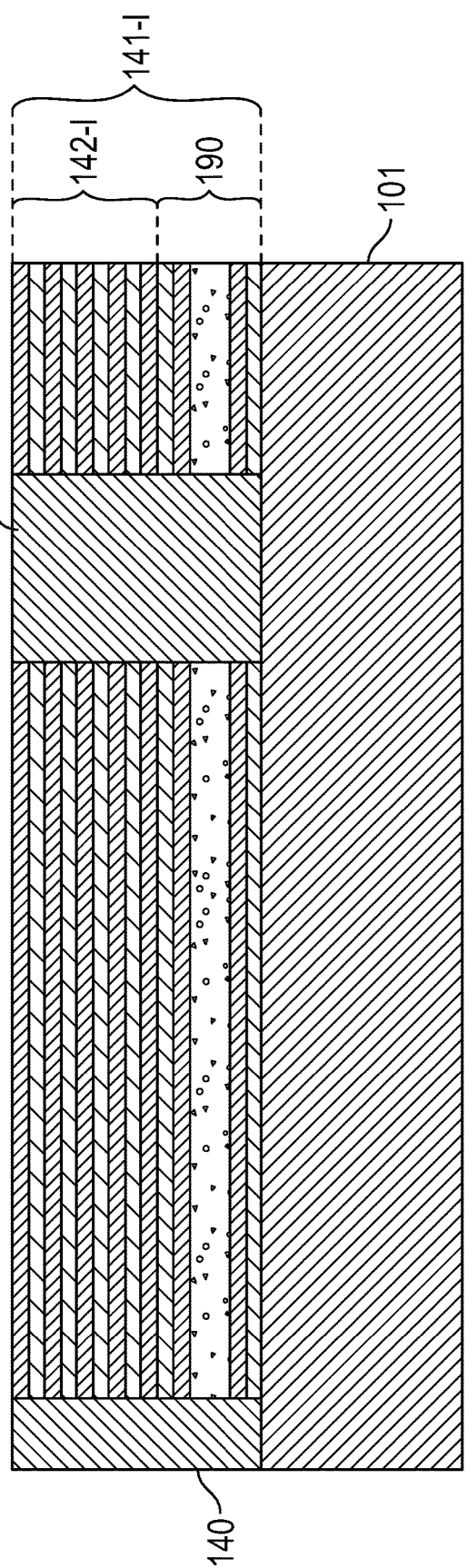

FIG. 3B shows the cross-sectional view of the semiconductor device 100 after the BSG cut bars 140 and the initial support structures 130 are formed in the first stack of initial layers 141-I.

Figure 3C:
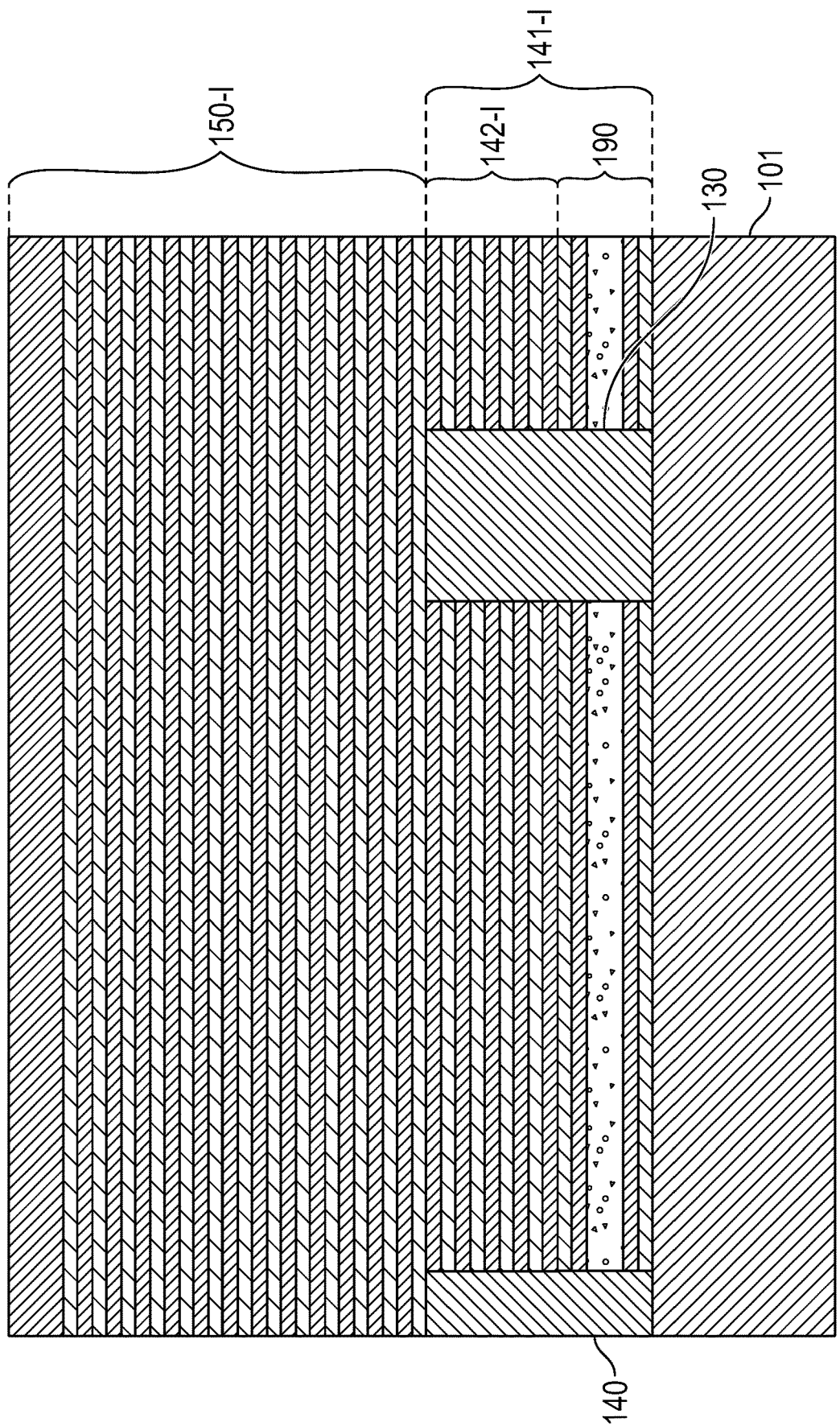

Referring back to FIG. 2, at S230, a second stack of initial layers is stacked on the first stack of initial layers. The second stack of initial layer includes gate sacrificial layers and insulating layers that are used to form memory cell transistors and top select transistors. When the gate sacrificial layers are replaced by gate layers, the second stack of initial layers becomes the second stack of layers in the semiconductor device 100. FIG. 3C shows the cross-sectional view of the semiconductor device 100 after the second stack of initial layers 150-I is stacked on the first stack of initial layers 141-I.

Referring back to FIG. 2, at S240, channel structures are formed in the first stack of initial layers 141-I and the second stack of initial layers 150-I.

In some embodiments, staircase is formed in the staircase region and suitable planarization process is performed to obtain a relatively flat surface. Then, photo lithography technology is used to define patterns of channel holes and dummy channel holes in photoresist and/or hard mask layers, and etch technology is used to transfer the patterns into the second stack of initial layers 150-I and the first stack of initial layers 141-I. Thus, channel holes are formed in the core region and the staircase region.

Then, channel structures are formed in the channel holes. In some embodiments, dummy channel structures can be formed with the channel structures, thus the dummy channel structures are formed of the same materials as the channel structures. In an example, a blocking insulating layer is formed on the sidewall of channel holes. Then, a charge storage layer, a tunneling insulating layer, a semiconductor layer, and an insulating layer are sequentially stacked from the sidewall.

Figure 3D:
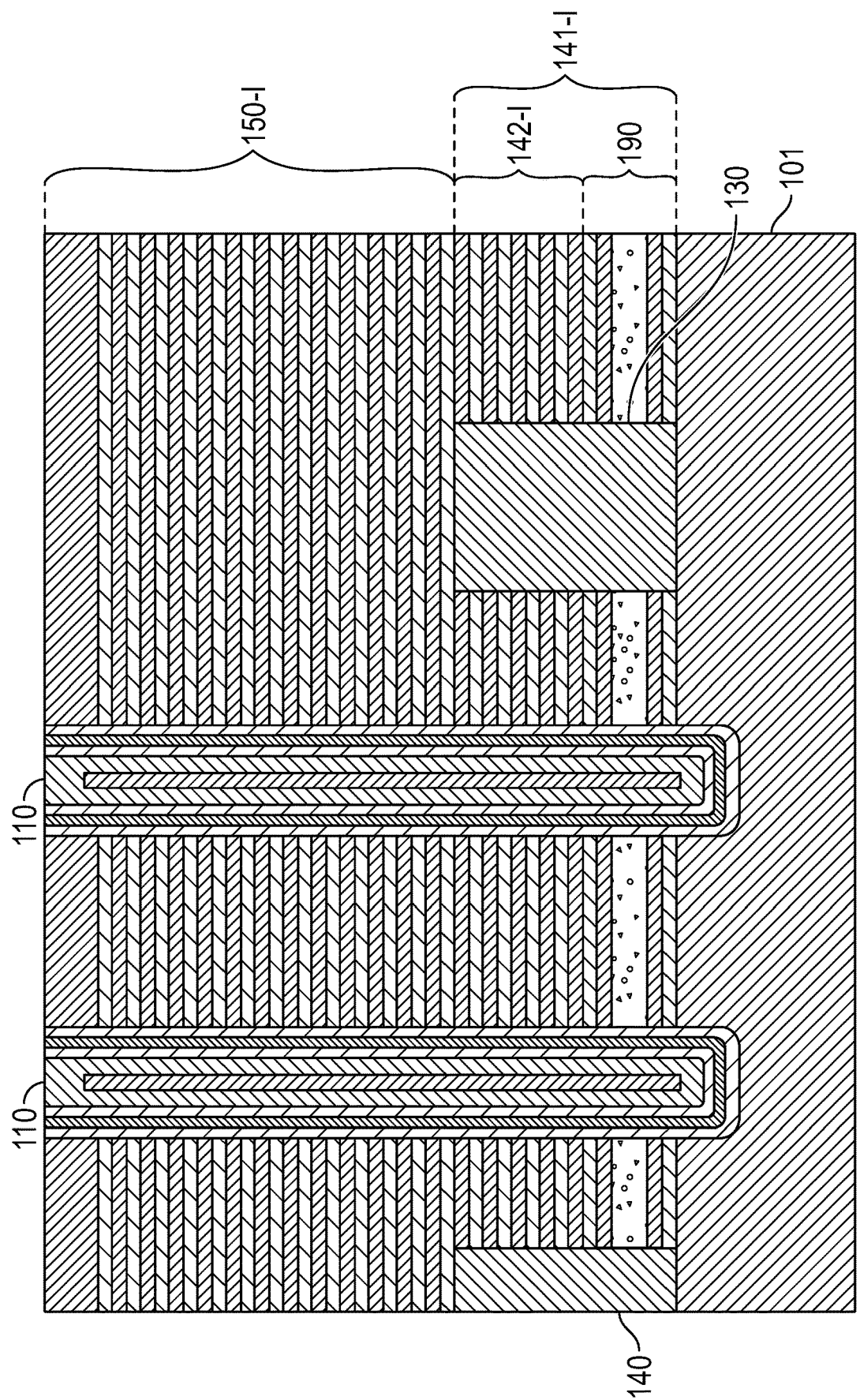

FIG. 3D shows the cross-sectional view of the semiconductor device after the formation of the channel structures 110.

Referring back to FIG. 2, at S250, gate line cut trenches (also referred to as gate line slits in some examples) are formed. In some embodiments, the gate line cut trenches are etched to a source sacrificial layer in the first stack of initial layers 141-I. In an example, the source sacrificial layers 190 includes a silicon oxide layer 191, a silicon nitride layer 192, a polysilicon layer 193, a silicon nitride layer 194 and a silicon oxide layer 195 from bottom, such as shown in FIG. 3A. The polysilicon layer 193 is sandwiched by two silicon nitride layers 192 and 194 and then two silicon oxide layers 191 and 195. Then, the etching of the gate line cut trenches stops at the polysilicon layer 193. The etching of the gate line cut trenches also etches the support structure 130. The etching of the gate line cut trenches is directional, and thus forms the "U" shape in the support structures 130.

Figure 3E:
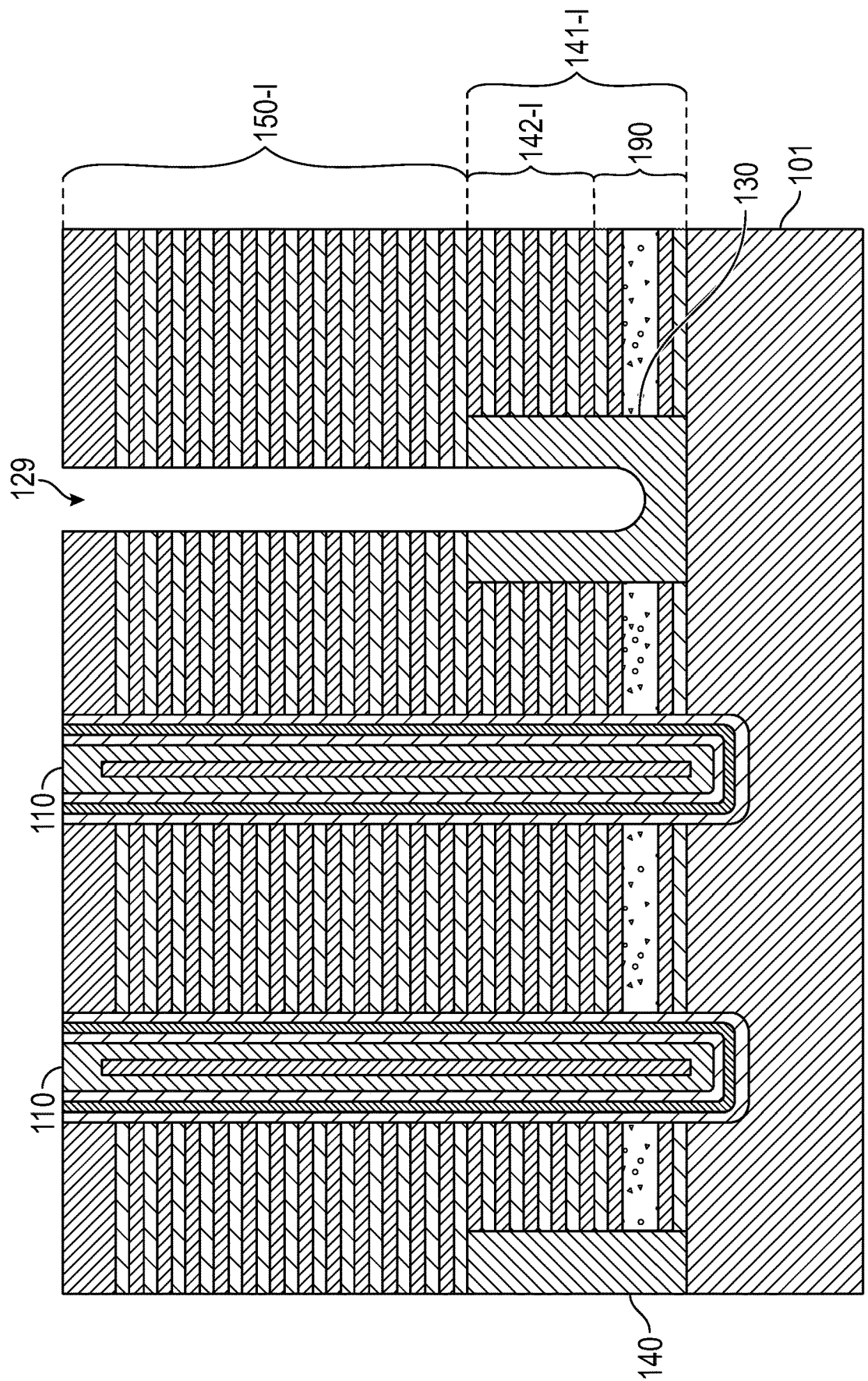

FIG. 3E shows the cross-sectional view of the semiconductor device after the formation of the gate line cut trenches 129. The etching of the gate line cut trenches stops at one of the source sacrificial layers, such as a polysilicon layer 193. The etching of the gate line cut trenches also etches the support structure 130 and thus forms the "U" shape in the support structures 130.

Referring back to FIG. 2, at S260, source sacrificial layers are removed via the gate line cut trenches. The removal of the source sacrificial layers forms source connection openings. In an example, when the polysilicon layer is sandwiched by two silicon nitride layers and then two silicon oxide layers, a first etchant is applied to remove the polysilicon layer. The silicon nitride layers can protect the other layers from damage due to the first etchant. Then, a second etchant is applied to remove the two silicon nitride layers. The silicon oxide layers can protect the other layers from damage due to the second etchant. Then, a third etchant is applied to remove the two silicon oxide layers.

Figure 3F:
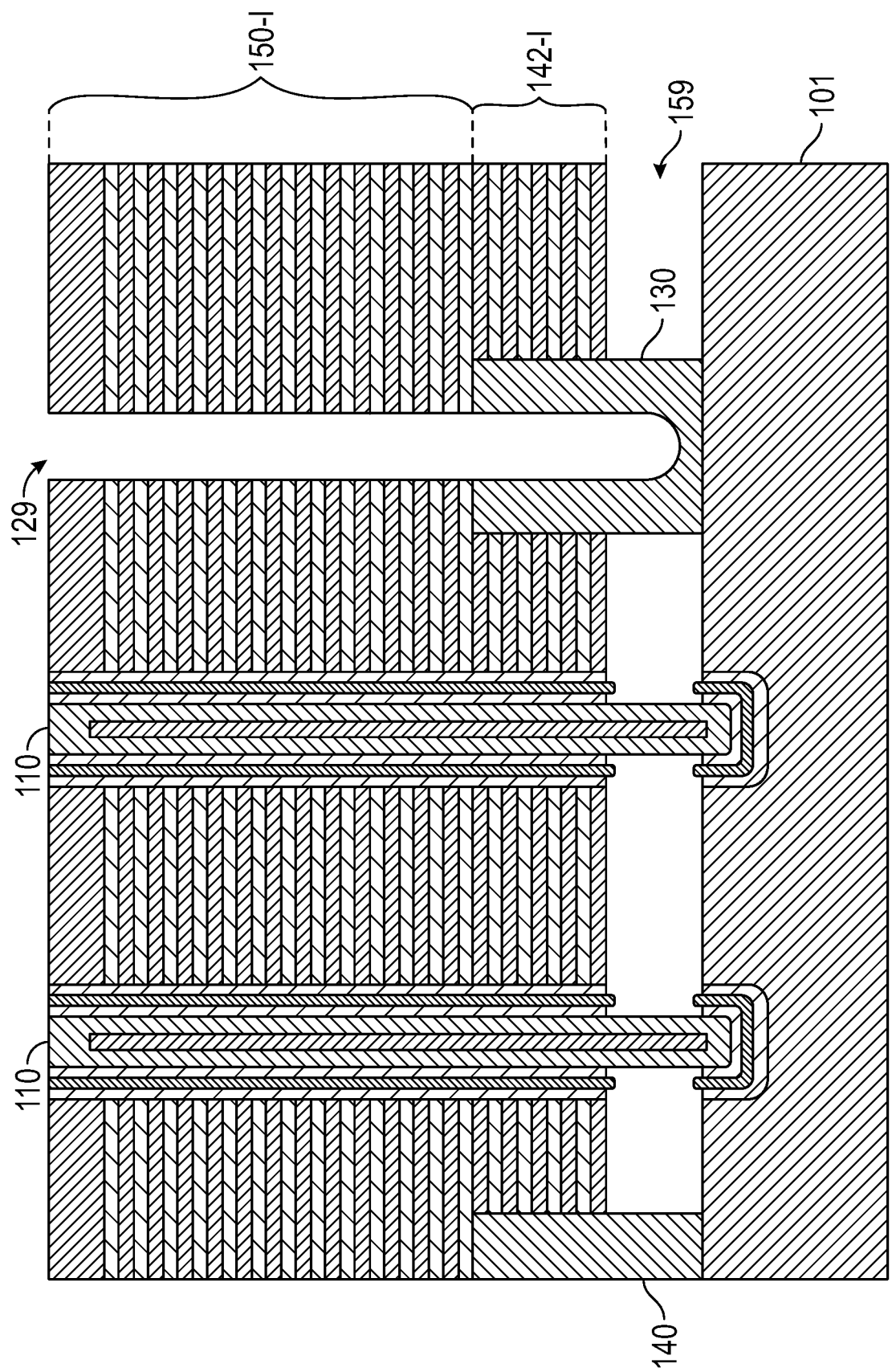

FIG. 3F shows a cross-sectional view of the semiconductor device after the removal of the source sacrificial layers via the gate line cut trenches. The removal of the source sacrificial layers forms source connection openings 159. It is noted that, in an example, the support structures 130 are formed of materials that have relatively high etch rate selectivity to the source sacrificial layers, thus the support structures 130 can stay in the semiconductor device after the removal of the source sacrificial layers, and can support the neighboring regions (e.g., edges of the array blocks), and reduce the risk of collapse.

It is noted that some of the layers that form the channel structures, such as the blocking insulating layer, the charge storage layer, the tunneling insulating layer that have oxide-nitride-oxide (ONO) structure, can be removed at the bottom of the channel structures that face the source connection openings 159, and the semiconductor layer of the channel structures at the bottom of the channel structures is exposed to the source connection openings.

It is also noted that, in an example, during the removal of the source sacrificial layers, the sidewalls of the gate line cut trenches can be covered with a protection layer to avoid etching of the sacrificial gate layers.

Referring back to FIG. 2, at S270, sidewall SEG is performed to grow epitaxial layer and fill the source connection openings with source connection material, such as doped silicon, doped polysilicon, doped amorphous and the like. The source connection material is then in contact with the semiconductor layer (for forming channel of the memory cells and select transistors) at the bottom of the channel structures and forms source connections.

At S280, further processes can be performed. In an example, real gates are formed. In some embodiments, using the gate line cut trenches, the gate sacrificial layers can be replaced by the gate layers. In an example, etchants to the gate sacrificial layers are applied via the gate line cut trenches to remove the gate sacrificial layers. In an example, the gate sacrificial layers are made of silicon nitride, and the hot sulfuric acid ($H_2SO_4$) is applied via the gate line cut trenches to remove the gate sacrificial layers. Further, via the gate line cut trenches, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

Further, in some examples, the fabrication process continues to, for example, fill the gate line cut trenches with spacer material (e.g., silicon oxide) and common source material (e.g., tungsten) to form the gate line cut structures. Further, contacts structures can be formed and metal traces can be formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first stack of layers including a source connection layer, the first stack of layers being stacked on a substrate along a first direction perpendicular to a main surface of the substrate;
a second stack of layers including gate layers and insulating layers, the gate layers and the insulating layers being stacked alternately upon the first stack of layers;
channel structures that are formed along the first direction in the first stack of layers and the second stack of layers;
a gate line cut structure having a trench that is cut through the first stack of layers and the second stack of layers, the trench being filled with at least an insulating layer; and
a support structure having a first portion that is disposed at a side of the gate line cut structure and extended from the side of the gate line cut structure and underneath the second stack of layers, wherein
a sidewall of the support structure along the first direction is horizontally adjacent in a second direction to at least one gate layer that is included in the first stack and above the source connection layer, the second direction being perpendicular to the first direction, and
the support structure extends through the source connection layer so that a bottom surface of the support structure is co-planar with a bottom surface of the source connection layer.

2. The semiconductor device of claim 1, wherein:
the support structure has a second portion embedded in the gate line cut structure.

3. The semiconductor device of claim 2, wherein:
the support structure has two arm structures that are disposed on opposite sides of the second portion, and extended from the side of the gate line cut structure and underneath the second stack of layers.

4. The semiconductor device of claim 1, wherein:
the first stack of layers includes one or more bottom select gate layers.

5. The semiconductor device of claim 4, wherein the semiconductor device further comprises:
a bottom select gate cut bar that is disposed in the first stack of layers, and is configured to insulate the one or more bottom select gate layers on either side of the bottom select gate cut bar.

6. The semiconductor device of claim 5, wherein:
the bottom select gate cut bar and the first portion of the support structure are of substantially the same height level.

7. The semiconductor device of claim 6, wherein:
the bottom select gate cut bar and the support structure are formed of the same materials.

8. The semiconductor device of claim 3, wherein the support structure is configured to have a "U" shape with the two arm structures that extend away from the gate line cut structure.

9. The semiconductor device of claim 1, wherein
the support structure is disposed in a gate line pick up region with nearby channel structures being dummy channel structures, and the support structure has a length that is longer than a threshold.

10. The semiconductor device of claim 1, wherein
the support structure is disposed in a region with nearby channel structures configured for data storage, and the support structure has a length that is shorter than a threshold.

11. The semiconductor device of claim 1, wherein
the support structure is formed of a material with an etch rate selectivity to source sacrificial layers being larger than a threshold, the source sacrificial layers being replaced by the source connection layer.

12. The semiconductor device of claim 1, wherein
the support structure is formed of a material with an etch rate selectivity to silicon oxide and silicon nitride being larger than a threshold.

13. The semiconductor device of claim 1, wherein
the support structure includes at least a layer of aluminum oxide.

14. The semiconductor device of claim 1, wherein:
the support structure extends completely through the first stack of layers.

* * * * *